(12) United States Patent
Bhandari et al.

(10) Patent No.: US 11,036,546 B1
(45) Date of Patent: Jun. 15, 2021

(54) MULTI-THREADED SHARED MEMORY FUNCTIONAL SIMULATION OF DATAFLOW GRAPH

(71) Applicant: Xilinx, Inc., San Jose, CA (US)

(72) Inventors: Kumud Bhandari, Campbell, CA (US); Ajit K. Agarwal, Hyderabad (IN)

(73) Assignee: XILINX, INC., San Jose, CA (US)

( * ) Notice: Subject to any disclaimer, the term of this patent is extended or adjusted under 35 U.S.C. 154(b) by 253 days.

(21) Appl. No.: 16/385,880

(22) Filed: Apr. 16, 2019

(51) Int. Cl.
*G06F 9/48* (2006.01)
*G06F 9/54* (2006.01)
*G06F 16/901* (2019.01)
*G06F 8/10* (2018.01)
*G06F 15/78* (2006.01)
*G06F 30/20* (2020.01)
*G06F 11/34* (2006.01)

(52) U.S. Cl.
CPC .............. *G06F 9/4881* (2013.01); *G06F 8/10* (2013.01); *G06F 9/544* (2013.01); *G06F 9/545* (2013.01); *G06F 11/3457* (2013.01); *G06F 15/7807* (2013.01); *G06F 16/9024* (2019.01); *G06F 30/20* (2020.01)

(58) Field of Classification Search
None
See application file for complete search history.

(56) References Cited

U.S. PATENT DOCUMENTS

| | | |
|---|---|---|
| 5,848,264 A | 12/1998 | Baird et al. |
| 6,090,156 A | 7/2000 | MacLeod |
| 7,080,283 B1 | 7/2006 | Songer et al. |
| 7,657,861 B2 | 2/2010 | Vorbach et al. |
| 7,721,090 B1 * | 5/2010 | Deepak ................... G06F 30/33 713/165 |
| 8,209,653 B2 | 6/2012 | Vorbach et al. |

(Continued)

OTHER PUBLICATIONS

Hsu, Chia-Jui et al.,"Multithreaded Simulation for Synchronous Dataflow Graphs," Proc. of the 2008 45th ACM/IEEE Design Automation Conference, Jul. 2, 2008, pp. 331-336, IEEE, Piscataway, New Jersey, USA.

(Continued)

*Primary Examiner* — Qing Chen
(74) *Attorney, Agent, or Firm* — Patterson + Sheridan, LLP

(57) ABSTRACT

Examples herein describe techniques for generating dataflow graphs using source code for defining kernels and communication links between those kernels. In one embodiment, the graph is formed using nodes (e.g., kernels) which are communicatively coupled by edges. A compiler converts the source code into a bit stream and/or object code which configures a heterogeneous processing environment of a SoC to execute the graph. Before implementing the dataflow graph on the SoC, the programmer may wish to simulate the dataflow graph. In one embodiment, each kernel in the dataflow graph is assigned a respective thread. Additionally, the simulator can include a runtime library for simulating the different types of communication links between the kernels. Even those these communication links are different protocols or have different semantics, using the simulation components in the library makes the different types of communication links composable so they can inter-operate in the same simulation environment.

20 Claims, 7 Drawing Sheets

(56) References Cited

U.S. PATENT DOCUMENTS

| | | | |
|---|---|---|---|
| 8,250,503 | B2 | 8/2012 | Vorbach et al. |
| 8,719,808 | B1 | 5/2014 | Prinzing |
| 8,838,431 | B1* | 9/2014 | Mihalache .............. G06F 30/33 |
| | | | 703/15 |
| 9,578,099 | B2 | 2/2017 | Llorca et al. |
| 10,628,622 | B1 | 4/2020 | Sivaraman et al. |
| 2002/0133325 | A1 | 9/2002 | Hoare et al. |
| 2003/0079207 | A1* | 4/2003 | Xavier ................... G06F 30/20 |
| | | | 717/135 |
| 2008/0114937 | A1 | 5/2008 | Reid et al. |
| 2010/0161938 | A1 | 6/2010 | Heddes et al. |
| 2010/0322237 | A1 | 12/2010 | Raja et al. |
| 2015/0160927 | A1* | 6/2015 | Stevens ................... G06F 8/34 |
| | | | 717/105 |
| 2015/0227674 | A1* | 8/2015 | Dumont ............... G06F 30/367 |
| | | | 716/107 |
| 2016/0132765 | A1 | 5/2016 | Alpert et al. |
| 2017/0161419 | A1 | 6/2017 | Ganusov et al. |
| 2017/0195258 | A1 | 7/2017 | Wang et al. |
| 2017/0207998 | A1 | 7/2017 | Fraisse |
| 2017/0220499 | A1 | 8/2017 | Gray |
| 2017/0364473 | A1 | 12/2017 | Singh et al. |
| 2019/0057305 | A1 | 2/2019 | Denolf et al. |
| 2020/0372200 | A1 | 11/2020 | Sivaraman et al. |

OTHER PUBLICATIONS

Hsu, Chia-Jui et al.,"Multithreaded Simulation for Synchronous Dataflow Graphs," ACM Transactions on Design Automation of Electronic Systems, Jun. 2011, pp. 25-1 to 25-23, vol. 16, Issue 3, Article 25, ACM, New York, New York, USA.

"Xilinx Unveils Revolutionary Adaptable Computing Product Category", Xilinx, Inc., Mar. 19, 2018, (https://www.xilinx.com/news/press/2018/xilinx-unveils-revolutionary-adaptable-computing-product-category.html).

"Versal: The First Adaptive Computer Acceleration Platform (ACAP)", Xilinx, Inc., WP505 (v1.0), Oct. 2, 2018(https://www.xilinx.com/support/documentation/white_papers/wp505-versal-acap.pdf).

Bokhari, S.H., "On the mapping problem," IEEE Transactions on Computers, Mar. 1981, vol. 1, No. 3, pp. 207-214.

Xilinx, "Xilinx AI Engines and Their Applications," WP506 (v1.0.2), Oct. 3, 2018, 13 pg., Xilinx, Inc., San Jose, California, USA.

Xilinx, "SDAccel Development Environment User Guide," UG1023 (v.2015.1), Sep. 15, 2015, 95 pg., Xilinx, Inc., San Jose, California, USA.

Xilinx, "Versal Architecture and Product Data Sheet: Overview," DS950 (v1.0), Oct. 2, 2018, 23 pg., Xilinx, Inc., San Jose, California, USA.

Roman Brillu et al, "Flextiles", Rapid Simulation and Performance Evaluation, ACM, 2 Penn Plaza, Suite 701, NY, NY 10121-0701 USA, Jan. 22, 2014.

Jaume Bosch et al, Exploiting Parallelism on GPUs and FPGAs iwth OmpSs, Proceedings of the 1st Workshop on Autotuning and Apadtivity Approaches for Energy Efficient HPC Systems, Andare17, Jan. 1, 2017.

Ingrid Verbauwhede et al, "Architectures and Desgin techniques for energy efficient embedded DSP and multimudia processing" ACM 2 Penn Plaza, Suite 701, NY, NY Jan. 1, 2004.

* cited by examiner

US 11,036,546 B1

MULTI-THREADED SHARED MEMORY FUNCTIONAL SIMULATION OF DATAFLOW GRAPH

TECHNICAL FIELD

Examples of the present disclosure generally relate to simulating a dataflow graph that includes multiple kernels communicatively coupled using heterogeneous channels.

BACKGROUND

A system on a chip (SoC) can include a mix of programmable logic and non-programmable logic such as processing cores or engines. Typically, a user must understand in detail the programmable and non-programmable hardware (and how they communicate) in order to generate source code which can be compiled into a bitstream for configuring the programmable and non-programmable hardware to perform a user function. But using sequential source code or Open Computing Language (OpenCL) to write programs for a SoC with a mix of programmable and non-programmable logic is cumbersome and difficult to parallelize. Data-parallelism and thread-parallelism are also used to express computations over an array of processors but these techniques do not extend naturally to programmable logic where heterogeneous computations with different interfaces need to be expressed.

Moreover, simulating a dataflow graph before it is implemented on a SoC is difficult since the dataflow graph should be parallelized. Further, the dataflow graph includes graph objects that extend across the programmable and non-programmable hardware in the SoC. Further complicating performing simulation, the graph objects can include heterogeneous communication links which use different communication protocols and/or synchronization primitives to communicate.

SUMMARY

Techniques for generating a simulation executable for a dataflow graph are described. One example is a method that includes receiving a graph specification defining a plurality of kernels and a plurality of communication links, where each of the plurality of communication links couple a respective pair of the plurality of kernels to form a dataflow graph. The method also includes assigning each of the plurality of kernels to one of a plurality of threads and identifying simulation components in a runtime library for the plurality of communication links, where the plurality of communication links comprises different communication protocols used in a heterogeneous processing environment in a SoC. The method includes connecting the threads using the simulation components and generating a simulation executable based on the threads and the simulation components for simulating the dataflow graph in the heterogeneous processing environment.

One example described herein is a host that includes a processor and a memory comprising a runtime library and a compiler. The compiler is configured to receive a graph specification defining a plurality of kernels and a plurality of communication links, where each of the plurality of communication links couple a respective pair of the plurality of kernels to form a dataflow graph and assign each of the plurality of kernels to a respective one of a plurality of threads. The compiler is also configured to identify simulation components in the runtime library for the plurality of communication links where the plurality of communication links comprises different communication protocols used in a heterogeneous processing environment in a SoC, connect the threads using the simulation components, and generate a simulation executable based on the threads and the simulation components for simulating the dataflow graph in the heterogeneous processing environment.

One example described herein is non-transitory computer readable storage medium comprising computer readable program code embodied thereon, the program code performs an operation when executed on a computer processor. The operation includes receiving a graph specification defining a plurality of kernels and a plurality of communication links, where each of the plurality of communication links couple a respective pair of the plurality of kernels to form a dataflow graph. The operation also includes assigning each of the plurality of kernels to a respective one of a plurality of threads and identifying simulation components in a runtime library for the plurality of communication links where the plurality of communication links comprises different communication protocols used in a heterogeneous processing environment in a SoC. The operation includes connecting the threads using the simulation components and generating a simulation executable based on the threads and the simulation components for simulating the dataflow graph in the heterogeneous processing environment.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
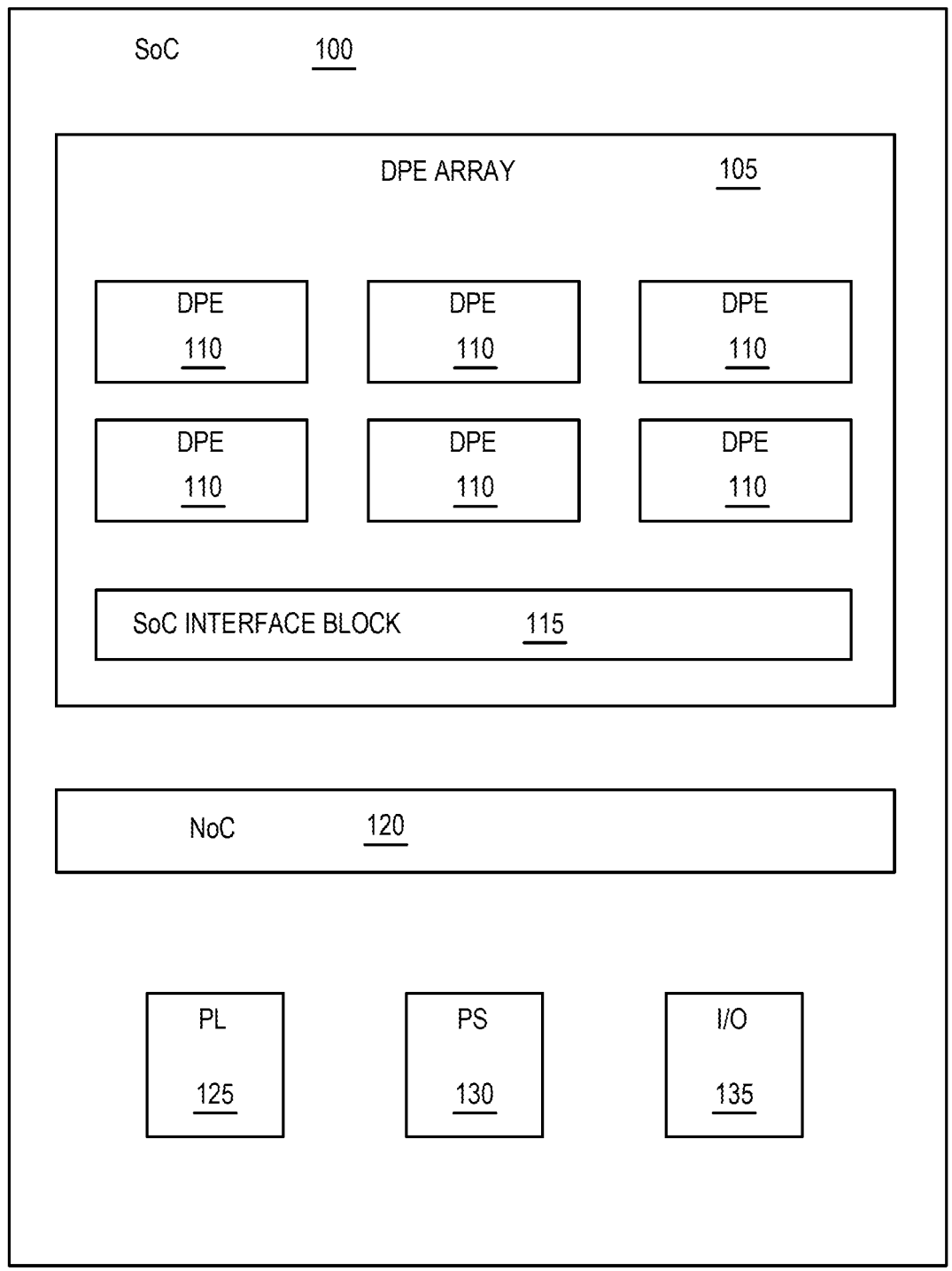
FIG. 1 is a block diagram of a SoC that includes a data processing engine array, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples herein describe techniques for generating dataflow graphs using source code for defining kernels and communication links between those kernels. In one embodiment, the graph is formed using nodes (e.g., kernels) which are communicatively coupled by edges (e.g., the communication links between the kernels). A compiler converts the source code into a bit stream and/or object code which configures programmable logic and non-programmable logic (which may be software configurable) in a heterogeneous processing environment of a SoC to execute the graph. Rather than requiring the programmer to understand in detail the programmable and non-programmable hardware in the heterogeneous processing environment, the compiler can use the graph expressed in source code to determine which kernels to assign to programmable logic and which to assign to non-programmable logic. Further, the compiler can select the specific communication techniques to establish the communication links between the kernels (e.g., shared memory, windowing, direct memory access (DMA), etc.). Furthermore, the compiler can determine whether synchronization should be used in a communication link and set up that synchronization without input from the programmer. Thus, the programmer can express the dataflow graph at a high-level (using source code) without understanding how the operator graph is implemented using the programmable and non-programmable hardware in the SoC.

Before implementing the dataflow graph on the SoC using the bitstream, the programmer may wish to simulate the dataflow graph on a generic computing system (e.g., using central processing units (CPUs) such as x86 type processors). That is, even though the dataflow graph may be intended to execute in a heterogeneous programming environment that includes programmable and non-programmable hardware, the programmer may first simulate the dataflow graph using threads executed by CPUs in a homogeneous processing environment. In one embodiment, each kernel in the dataflow graph is assigned a respective thread. Because scheduling each thread may result in congestion (and result in the simulation being unable to scale well), the simulation may use a wait and notify scheme where a thread is only eligible for scheduling if the corresponding kernel has data waiting to be processed.

Additionally, the simulator can include a runtime library for simulating the different types of communication links between the kernels. For example, the library may contain different simulation components such as a memory buffer connector, a stream connector, a run time parameter connector, and the like which can simulate the different communication links in the SoC. Even those these communication links have different protocols, semantics, or synchronization primitives, using the simulation components in the library makes the different types of communication links composable so they can inter-operate in the same simulation environment.

FIG. 1 is a block diagram of a SoC 100 that includes a data processing engine (DPE) array 105, according to an example. The DPE array 105 includes a plurality of DPEs 110 which may be arranged in a grid, cluster, or checkerboard pattern in the SoC 100. Although FIG. 1 illustrates arranging the DPEs 110 in a 2D array with rows and columns, the embodiments are not limited to this arrangement. Further, the array 105 can be any size and have any number of rows and columns formed by the DPEs 110.

In one embodiment, the DPEs 110 are identical. That is, each of the DPEs 110 (also referred to as tiles or blocks) may have the same hardware components or circuitry. Further, the embodiments herein are not limited to DPEs 110. Instead, the SoC 100 can include an array of any kind of processing elements, for example, the DPEs 110 could be digital signal processing engines, cryptographic engines, Forward Error Correction (FEC) engines, or other specialized hardware for performing one or more specialized tasks.

In FIG. 1, the array 105 includes DPEs 110 that are all the same type (e.g., a homogeneous array). However, in another embodiment, the array 105 may include different types of engines. For example, the array 105 may include digital signal processing engines, cryptographic engines, graphic processing engines, and the like. Regardless if the array 105 is homogenous or heterogeneous, the DPEs 110 can include direct connections between DPEs 110 which permit the DPEs 110 to transfer data directly as described in more detail below.

In one embodiment, the DPEs 110 are formed from non-programmable logic—i.e., are hardened. One advantage of doing so is that the DPEs 110 may take up less space in the SoC 100 relative to using programmable logic to form the hardware elements in the DPEs 110. That is, using hardened logic circuitry to form the hardware elements in the DPE 110 such as program memories, an instruction fetch/decode unit, fixed-point vector units, floating-point vector units, arithmetic logic units (ALUs), multiply accumulators (MAC), and the like can significantly reduce the footprint of the array 105 in the SoC 100. Although the DPEs 110 may be hardened, this does not mean the DPEs 110 are not programmable. That is, the DPEs 110 can be configured when the SoC 100 is powered on or rebooted to perform different functions or tasks.

The DPE array 105 also includes a SoC interface block 115 (also referred to as a shim) that serves as a communication interface between the DPEs 110 and other hardware components in the SoC 100. In this example, the SoC 100 includes a network on chip (NoC) 120 that is communicatively coupled to the SoC interface block 115. Although not shown, the NoC 120 may extend throughout the SoC 100 to permit the various components in the SoC 100 to communicate with each other. For example, in one physical implementation, the DPE array 105 may be disposed in an upper right portion of the integrated circuit forming the SoC 100. However, using the NoC 120, the array 105 can nonetheless communicate with, for example, programmable logic (PL) 125, a processor subsystem (PS) 130 or input/output (I/O) 135 which may disposed at different locations throughout the SoC 100.

In addition to providing an interface between the DPEs 110 and the NoC 120, the SoC interface block 115 may also provide a connection directly to a communication fabric in the PL 125. In this example, the PL 125 and the DPEs 110 form a heterogeneous processing environment since some of the kernels in a dataflow graph may be assigned to the DPEs 110 for execution while others are assigned to the PL 125. This can be difficult for a programmer to manage since communicating between kernels disposed in heterogeneous or different processing cores can include using the various communication interfaces shown in FIG. 1 such as the NoC 120, the SoC interface block 115, as well as the communication links between the DPEs 110 in the array 105 (which as shown in FIG. 2).

In one embodiment, the SoC interface block 115 includes separate hardware components for communicatively coupling the DPEs 110 to the NoC 120 and to the PL 125 that is disposed near the array 105 in the SoC 100. In one embodiment, the SoC interface block 115 can stream data directly to a fabric for the PL 125. For example, the PL 125 may include an FPGA fabric which the SoC interface block 115 can stream data into, and receive data from, without using the NoC 120. That is, the circuit switching and packet switching described herein can be used to communicatively couple the DPEs 110 to the SoC interface block 115 and also to the other hardware blocks in the SoC 100. In another example, SoC interface block 115 may be implemented in a different die than the DPEs 110. In yet another example, DPE array 105 and at least one subsystem may be implemented in a same die while other subsystems and/or other DPE arrays are implemented in other dies. Moreover, the streaming interconnect and routing described herein with respect to the DPEs 110 in the DPE array 105 can also apply to data routed through the SoC interface block 115.

Although FIG. 1 illustrates one block of PL 125, the SoC 100 may include multiple blocks of PL 125 (also referred to as configuration logic blocks) that can be disposed at different locations in the SoC 100. For example, the SoC 100 may include hardware elements that form a field programmable gate array (FPGA). However, in other embodiments, the SoC 100 may not include any PL 125—e.g., the SoC 100 is an ASIC.

Figure 2:
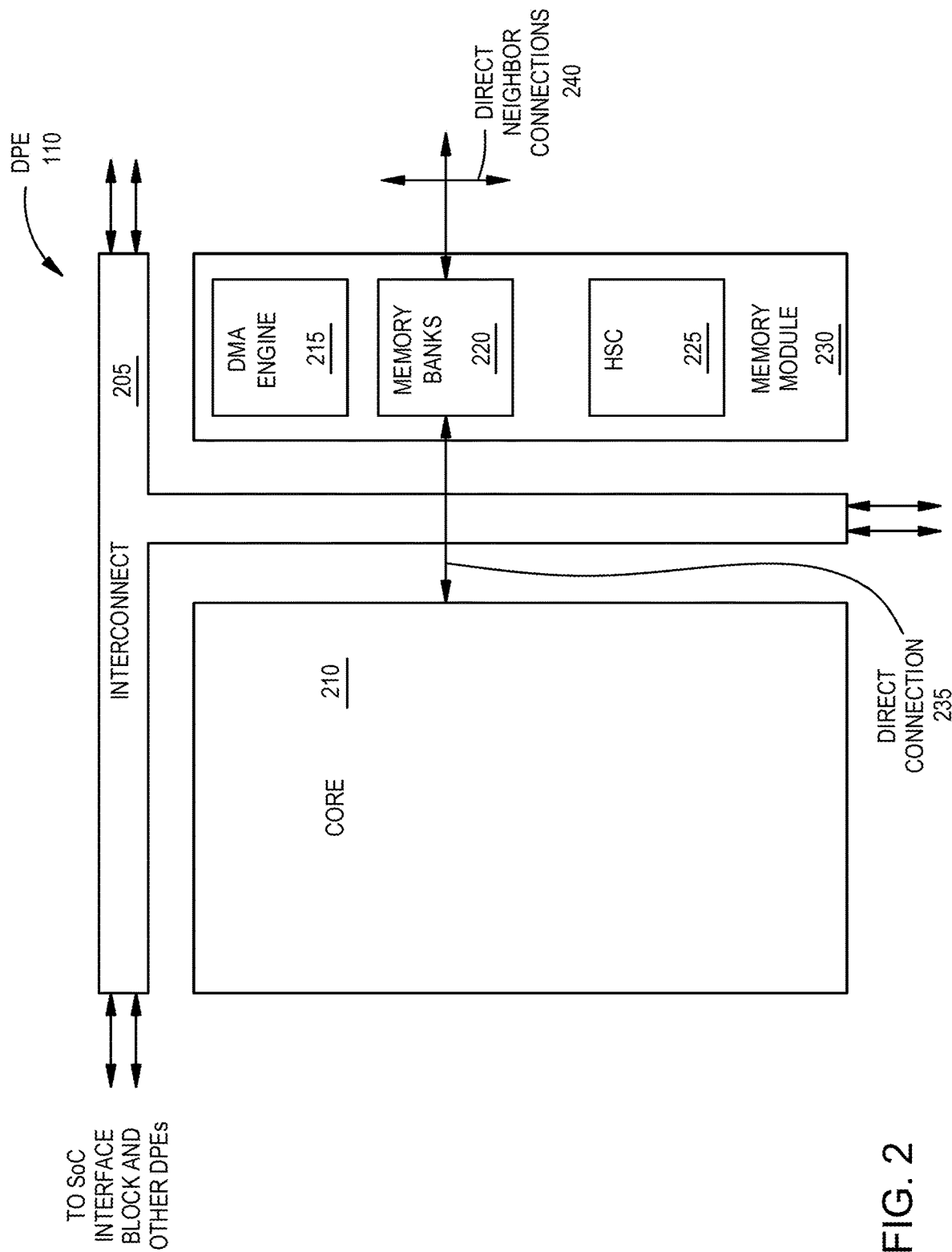
FIG. 2 is a block diagram of a data processing engine in the data processing engine array, according to an example.

FIG. 2 is a block diagram of a DPE 110 in the DPE array 105 illustrated in FIG. 1, according to an example. The DPE 110 includes an interconnect 205, a core 210, and a memory module 230. The interconnect 205 permits data to be transferred from the core 210 and the memory module 230 to different cores in the array 105. That is, the interconnect 205 in each of the DPEs 110 may be connected to each other so that data can be transferred north and south (e.g., up and down) as well as east and west (e.g., right and left) in the array of DPEs 110.

Referring back to FIG. 1, in one embodiment, the DPEs 110 in the upper row of the array 105 relies on the interconnects 205 in the DPEs 110 in the lower row to communicate with the SoC interface block 115. For example, to transmit data to the SoC interface block 115, a core 210 in a DPE 110 in the upper row transmits data to its interconnect 205 which is in turn communicatively coupled to the interconnect 205 in the DPE 110 in the lower row. The interconnect 205 in the lower row is connected to the SoC interface block 115. The process may be reversed where data intended for a DPE 110 in the upper row is first transmitted from the SoC interface block 115 to the interconnect 205 in the lower row and then to the interconnect 205 in the upper row that is the target DPE 110. In this manner, DPEs 110 in the upper rows may rely on the interconnects 205 in the DPEs 110 in the lower rows to transmit data to and receive data from the SoC interface block 115.

In one embodiment, the interconnect 205 includes a configurable switching network that permits the user to determine how data is routed through the interconnect 205. In one embodiment, unlike in a packet routing network, the interconnect 205 may form streaming point-to-point connections. That is, the streaming connections and streaming interconnects (not shown in FIG. 2) in the interconnect 205 may form routes from the core 210 and the memory module 230 to the neighboring DPEs 110 or the SoC interface block 115. Once configured, the core 210 and the memory module 230 can transmit and receive streaming data along those routes. In one embodiment, the interconnect 205 is configured using the Advanced Extensible Interface (AXI) 4 Streaming protocol.

In addition to forming a streaming network, the interconnect 205 may include a separate network for programming or configuring the hardware elements in the DPE 110. Although not shown, the interconnect 205 may include a memory mapped interconnect which includes different connections and switch elements used to set values of configuration registers in the DPE 110 that alter or set functions of the streaming network, the core 210, and the memory module 230.

In one embodiment, streaming interconnects (or network) in the interconnect 205 support two different modes of operation referred to herein as circuit switching and packet switching. In one embodiment, both of these modes are part of, or compatible with, the same streaming protocol—e.g., an AXI Streaming protocol. Circuit switching relies on reserved point-to-point communication paths between a source DPE 110 to one or more destination DPEs 110. In one embodiment, the point-to-point communication path used when performing circuit switching in the interconnect 205 is not shared with other streams (regardless whether those streams are circuit switched or packet switched). However, when transmitting streaming data between two or more DPEs 110 using packet-switching, the same physical wires can be shared with other logical streams.

The core 210 may include hardware elements for processing digital signals. For example, the core 210 may be used to process signals related to wireless communication, radar, vector operations, machine learning applications, and the like. As such, the core 210 may include program memories, an instruction fetch/decode unit, fixed-point vector units, floating-point vector units, arithmetic logic units (ALUs), multiply accumulators (MAC), and the like. However, as mentioned above, this disclosure is not limited to DPEs 110. The hardware elements in the core 210 may change depending on the engine type. That is, the cores in a digital signal processing engine, cryptographic engine, or FEC may be different.

The memory module 230 includes a direct memory access (DMA) engine 215, memory banks 220, and hardware synchronization circuitry (HSC) 225 or other type of hardware synchronization block. In one embodiment, the DMA engine 215 enables data to be received by, and transmitted to, the interconnect 205. That is, the DMA engine 215 may be used to perform DMA reads and write to the memory banks 220 using data received via the interconnect 205 from the SoC interface block or other DPEs 110 in the array.

The memory banks 220 can include any number of physical memory elements (e.g., SRAM). For example, the memory module 230 may be include 4, 8, 16, 32, etc. different memory banks 220. In this embodiment, the core 210 has a direct connection 235 to the memory banks 220. Stated differently, the core 210 can write data to, or read data from, the memory banks 220 without using the interconnect 205. That is, the direct connection 235 may be separate from the interconnect 205. In one embodiment, one or more wires in the direct connection 235 communicatively couple the core 210 to a memory interface in the memory module 230 which is in turn coupled to the memory banks 220.

In one embodiment, the memory module 230 also has direct connections 240 to cores in neighboring DPEs 110. Put differently, a neighboring DPE in the array can read data from, or write data into, the memory banks 220 using the direct neighbor connections 240 without relying on their interconnects or the interconnect 205 shown in FIG. 2. The HSC 225 can be used to govern or protect access to the memory banks 220. In one embodiment, before the core 210 or a core in a neighboring DPE can read data from, or write data into, the memory banks 220, the HSC 225 provides a lock to an assigned portion of the memory banks 220 (referred to as a "buffer"). That is, when the core 210 wants to write data, the HSC 225 provides a lock to the core 210 which assigns a portion of a memory bank 220 (or multiple memory banks 220) to the core 210. Once the write is complete, the HSC 225 can release the lock which permits cores in neighboring DPEs to read the data.

Because the core 210 and the cores in neighboring DPEs 110 can directly access the memory module 230, the memory banks 220 can be considered as shared memory between the DPEs 110. That is, the neighboring DPEs can directly access the memory banks 220 in a similar way as the core 210 that is in the same DPE 110 as the memory banks 220. Thus, if the core 210 wants to transmit data to a core in a neighboring DPE, the core 210 can write the data into the memory bank 220. The neighboring DPE can then retrieve the data from the memory bank 220 and begin processing the data. In this manner, the cores in neighboring DPEs 110 can transfer data using the HSC 225 while avoiding the extra latency introduced when using the interconnects 205. In contrast, if the core 210 wants to transfer data to a non-neighboring DPE in the array (i.e., a DPE without a direct connection 240 to the memory module 230), the core 210 uses the interconnects 205 to route the data to the memory module of the target DPE which may take longer to complete because of the added latency of using the interconnect 205 and because the data is copied into the memory module of the target DPE rather than being read from a shared memory module.

In addition to sharing the memory modules 230, the core 210 can have a direct connection to cores 210 in neighboring DPEs 110 using a core-to-core communication link 250. That is, instead of using either a shared memory module 230 or the interconnect 205, the core 210 can transmit data to another core in the array directly without storing the data in a memory module 230 or using the interconnect 205 (which can have buffers or other queues). For example, communicating using the core-to-core communication links 250 may use less latency (or have high bandwidth) than transmitting data using the interconnect 205 or shared memory (which requires a core to write the data and then another core to read the data) which can offer more cost effective communication. In one embodiment, the core-to-core communication links 250 can transmit data between two cores 210 in one clock cycle. In one embodiment, the data is transmitted between the cores on the link 250 without being stored in any memory elements external to the cores 210. In one embodiment, the core 210 can transmit a data word or vector to a neighboring core using the links 250 every clock cycle, but this is not a requirement.

In one embodiment, the communication links 250 are streaming data links which permit the core 210 to stream data to a neighboring core. Further, the core 210 can include any number of communication links 250 which can extend to different cores in the array. In this example, the DPE 110 has respective core-to-core communication links 250 to cores located in DPEs in the array that are to the right and left (east and west) and up and down (north or south) of the core 210. However, in other embodiments, the core 210 in the DPE 110 illustrated in FIG. 2 may also have core-to-core communication links 250 to cores disposed at a diagonal from the core 210. Further, if the core 210 is disposed at a bottom periphery or edge of the array, the core may have core-to-core communication links to only the cores to the left, right, and bottom of the core 210.

However, using shared memory in the memory module 230 or the core-to-core communication links 250 may be available if the destination of the data generated by the core 210 is a neighboring core or DPE. For example, if the data is destined for a non-neighboring DPE (i.e., any DPE that DPE 110 does not have a direct neighboring connection 240 or a core-to-core communication link 250), the core 210 uses the interconnects 205 in the DPEs to route the data to the appropriate destination. As mentioned above, the interconnects 205 in the DPEs 110 may be configured when the SoC is being booted up to establish point-to-point streaming connections to non-neighboring DPEs to which the core 210 will transmit data during operation.

Figure 3A:
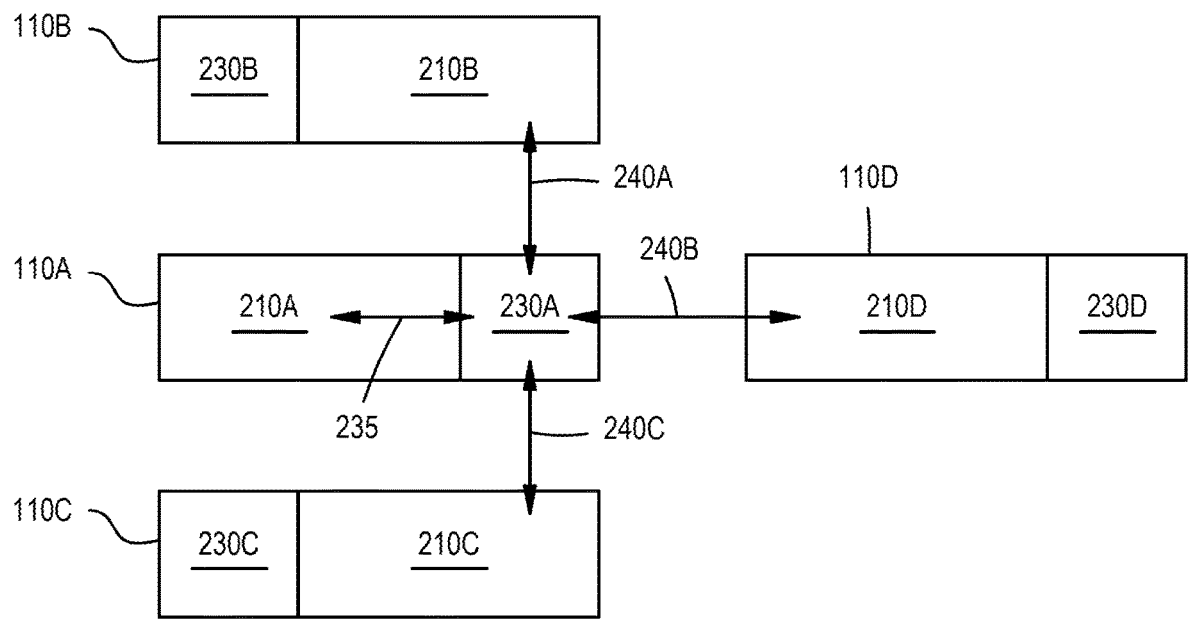
FIGS. 3A and 3B illustrate a memory module shared by multiple DPEs in a DPE array, according to an example.
Figure 3B:
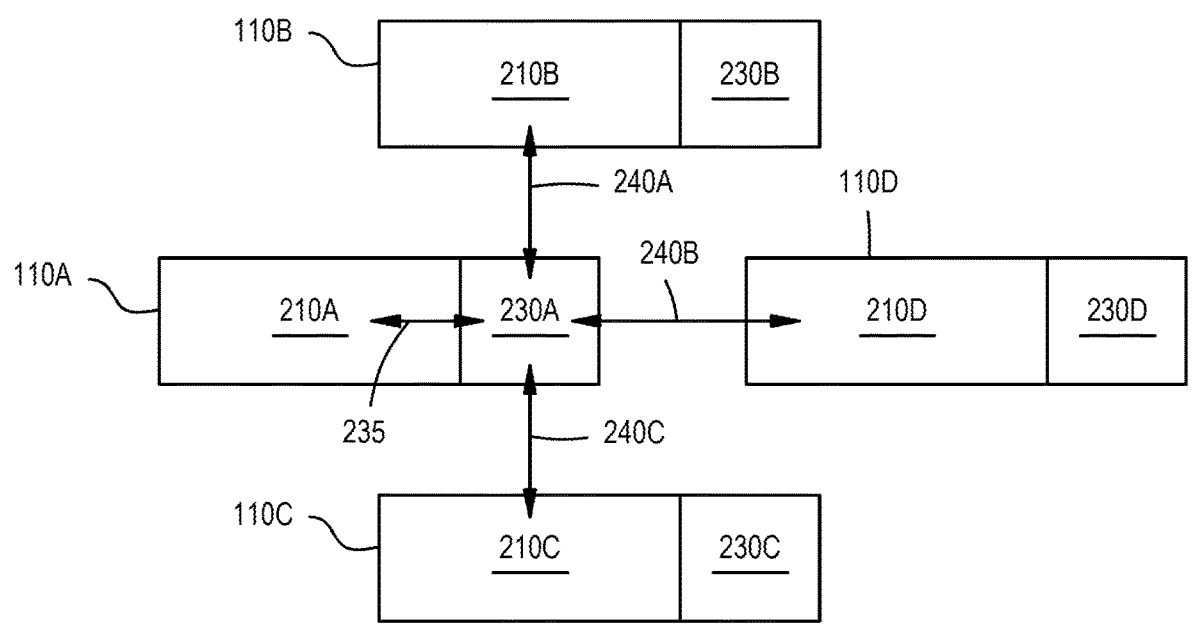

FIGS. 3A-3B illustrate a memory module 230A shared by multiple DPEs 110 in a DPE array, according to an example. As shown, the memory module 230A has direct connections to four cores—i.e., cores 210A-D. The memory module 230A is in the same DPE (i.e., DPE 110A) as the core 210A. As such, the direct connection 235 is an intra-engine connection. However, the memory module 230A is in a different DPE than the cores 210B-D. As such, the direct neighboring connections 240A-C are inter-engine connections since these connections 240 span across an interface between DPEs 110 in the array. For clarity, the interconnects in each of the DPEs 110 have been omitted.

In FIG. 3A, the memory module 230A in the DPE 110A is disposed to the right of the core 210A. The same is true for the DPE 110D located to the right of the DPE 110A (i.e., is east of the DPE 110A). As such, the core 210D in the DPE 110D directly neighbors the memory module 230A which makes establishing the direct neighboring connection 240B between the memory module 230A and the core 210D easier than if the memory module 230D were disposed to the left of the core 210D—i.e., if the memory module 230D were disposed between the memory module 230A and the core 210D.

Unlike the DPEs 110A and 110D, in the DPEs 110B and 110C, the cores 210B and 210C are disposed to the right of the memory modules 230B and 230C. As a result, the cores 210B and 210C are disposed directly above and directly below the memory module 230A (i.e., the cores 210B and 210C are north and south of the memory module 230A). Doing so makes establishing the direct neighboring connections 240A and 240C between the shared memory module 230A and the cores 210B and 210C easier than if the cores 210B and 210C were disposed to the left of the memory modules 230B and 230C. Using the arrangement shown in FIG. 3A, the memory module 230A has direct connections 235 and 240 to the cores 210A-D that are located in the same DPE and neighboring DPEs which means the memory module 230A is a shared memory for the DPEs 110A-D. Although FIG. 3A illustrates sharing the memory module 230A between four cores 210, in other embodiments the memory module 230A may be shared by more or less cores. For example, the memory module 230A may also have direct connections to neighboring DPEs that are arranged at a diagonal relative to the DPE 110A.

The arrangement of the DPEs 110 illustrated in FIG. 3A is just one example of a suitable arrangement of the DPEs 110 to provide direct connections to the memory module 230A from the neighboring cores 210. In FIG. 3B, the DPEs 110 in the different rows are staggered. That is, instead of the DPEs 110 in the same column being aligned, the DPEs 110 are offset. In this arrangement, the cores 210B and 210C are disposed to the left of the memory modules 230B and 230C (unlike what is shown in FIG. 3A) and still are directly above and beneath the shared memory module 230A by shifting the DPEs 110B and 110C to the right relative to the DPE 110A. As such, the direct connection 240A-C can be formed in the SoC to enable the memory module 230A to be shared by the cores 210A-D.

Moreover, although not shown in FIGS. 3A and 3B, the memory modules 230B-D may also be shared memory modules. For example, the memory module 230D may have direct connection to cores in DPEs that are disposed above, below, and to the right (i.e., to the north, south, and east) of the DPE 110D. In this manner, the memory module 230D can be shared with cores in neighboring DPEs. However, the memory modules 230 in DPEs disposed at the edges or periphery of the array may be shared by fewer numbers of cores (or may not be shared at all).

Figure 4:
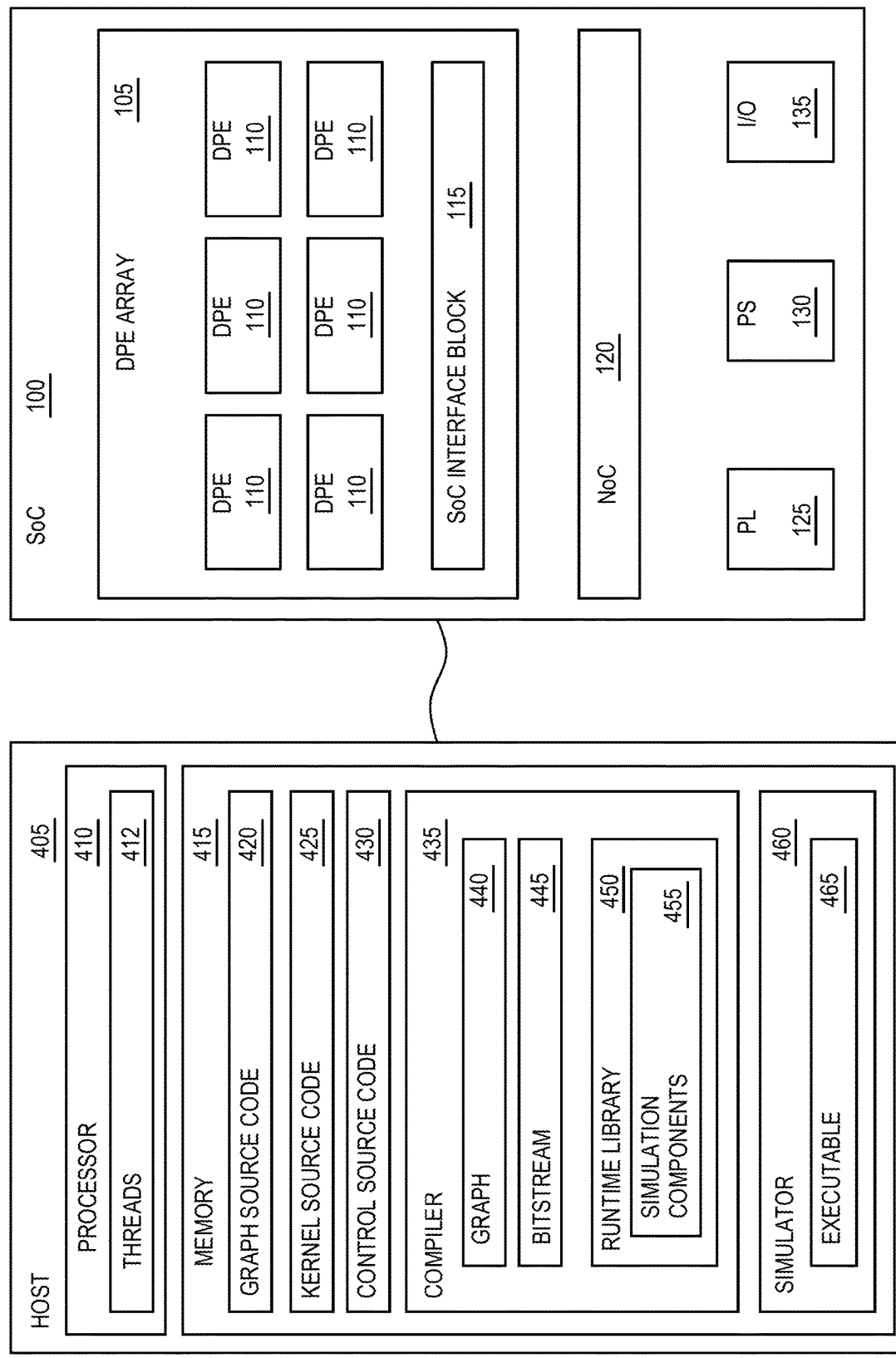
FIG. 4 is a block diagram of a computing system for implementing a dataflow graph on the SoC illustrated in FIG. 1, according to an example.

FIG. 4 is a block diagram of a computing system 400 for implementing a dataflow graph 440 on the SoC 100 illustrated in FIG. 1, according to an example. The system 400 includes a host 405 (e.g., a host computing system) which includes a processor 410 and memory 415. The processor 410 represents any number of processing elements which each can contain any number of processing cores. The memory 415 can include volatile and non-volatile memory elements. Moreover, the memory 415 can be disposed within the same apparatus (e.g., a server) or can be distributed across the computing system 400 (e.g., a cloud computing environment).

The memory 415 includes graph source code 420, kernel source code 425, control source code 430, and a compiler 435. The graph source code 420 can be written in various types of object orientated programming languages (e.g., C++). Generally, the graph source code 420 defines kernels (e.g., nodes) which are connected via communication links (e.g., edges). The combination of the kernels and the communication links form the graph 440.

One advantage of defining a dataflow graph 440 using the source code 420 is that graphs have a highly parallelized architecture. A programmer can start with a parallel definition (e.g., the graph) which the compiler 435 then implements in the hardware of the SoC 100. The graph 440 enables the data to flow between the nodes (e.g., the kernels) in the graph 440 when the data is available which limits stalls. Moreover, the graph 440 provides the programmer with significant freedom to map the computation and the data flows to DPEs 110 and programmable logic 125 in the SoC 100.

In one embodiment, the semantics of the graph 440 established by the graph source code 420 is based upon the general theory of Kahn Process Networks which provides a computation model for deterministic parallel computation that is applied to the heterogeneous architecture in the SoC 100 (which includes both programmable and hardened hardware). Moreover, the graph source code 420 is tolerant for communication latencies between the nodes in the graph 440, and as a result, extends naturally to graphs that map to multiple super logic regions and multiple SoC devices (e.g., multiple FPGAs).

Another advantage of using the source code 420 to define a dataflow graph is that a sequential program, in contrast, fixes the control flow and the order of computation. When using a dataflow graph, predictable and reproducible responses to input are obtained without a race condition. While there is a risk of deadlock, this can be solved or mitigated by managing the storage assigned to each node or kernel.

The kernel source code 425 can be written in various types of object orientated programming languages. The kernel source code 425 defines the attributes of a particular kernel or node in the dataflow graph 440. In one embodiment, the kernel source code 425 defines the operation of each kernel within the graph source code 420.

The control source code 430 can be written in various types of object orientated programming languages. In one embodiment, the control source code 430 defines a control program, that when executed, controls the execution of the graph 440 when implemented on the SoC 100. For example, the control source code 430 may control when the graph 440 executes, the number of iterations the graph 440 executes, and when the graph 440 stops executing. The control program generated from the control source code 430 can execute on the host 405 (e.g., in a datacenter solution) or within the SoC 100 (e.g., the PS 130).

The compiler 435 is a software application that can compile the source code 420, 425, and 430. For example, using the graph source code 420 (and other libraries not shown in FIG. 4), the compiler 435 can generate the graph 440 which can be implemented on the SoC 100 which will be described in more detail below. In one embodiment, the graph 440 is converted into a bitstream 445 which is transmitted to the SoC 100 to configure the SoC 100 to execute the graph 440.

However, in one embodiment, rather than preparing the bitstream 445 for the SoC, the compiler 435 generates a bitstream 445 for simulating the dataflow graph 440 on a simulator 460. That is, the bitstream 445 can be used to form an executable 465 which simulates the dataflow graph 440. Thus, instead of the graph 440 being implemented in the heterogeneous processing environment of the SoC 100, the graph 440 can be simulated on the processors 410 of the host 405 (or a fleet of computing systems). In one embodiment, the processors 410 may be a generic processor (referred to as a CPU) but could be a special processor for performing simulation. In one embodiment, the processors 410 are x86 type processors.

As discussed in more detail below, the compiler 435 can assign the various data objects in the graph 440 such as the nodes and edges (e.g., the kernels and communication links) to threads that are executed by the processors 410. In one embodiment, the compiler 435 assigns each kernel in the graph 440 to a respective thread to maximize the simulated parallelism of the graph 440.

The compiler 435 includes a runtime library 450 for forming a composable system from the different types of communication links that may be present in the dataflow graph 440. For example, the compiler 435 (or programmer) may assign different types of communication links between different kernels in the SoC 100. For example, a kernel that is hosted in the PL 125 may need to directly communicate with a kernel hosted in one of the DPEs 110. The compiler 435 may choose a stream communication link that uses the SoC interface block 115 and the interconnect 205 illustrated in FIG. 2. Alternatively, two kernels may be hosted in two neighboring DPEs 110 in the array 105. For example, referring to FIG. 3A, one kernel may be hosted on the core 210b while another is hosted on core 210C. The compiler 435 may provide a buffer in the memory 230A (which is shared by the cores 210b and 210C) that can be used by the two kernels to communicate. In another example, two or more kernels may need to communicate but are located on non-neighboring DPEs 110. The compiler 435 can use a stream communication link in the interconnect to enable these kernels to communicate. In yet another example, the PS 130 may send commands that control the operation of the dataflow graph in the SoC 100 such as starting, pausing, resuming, or stopping the graph, or to dynamically update parameters used by the kernels. The compiler 435 may use a run time parameter (RTP) communication link for passing these commands from the PS 130 to the kernels in the DPE array 105 or the PL 125.

To permit the simulator 460 to simulate these different types of communication links between the kernels, the compiler 435 can use simulation components 455 in the runtime library 450 to generate a composable system where the various types of communication links can interoperate. That is, the compiler 435 can use the library 450 to generate a high composable system where the graph objects in the graph 440 can be selected and assembled in various combinations to satisfy specific user requirements.

Figure 5:
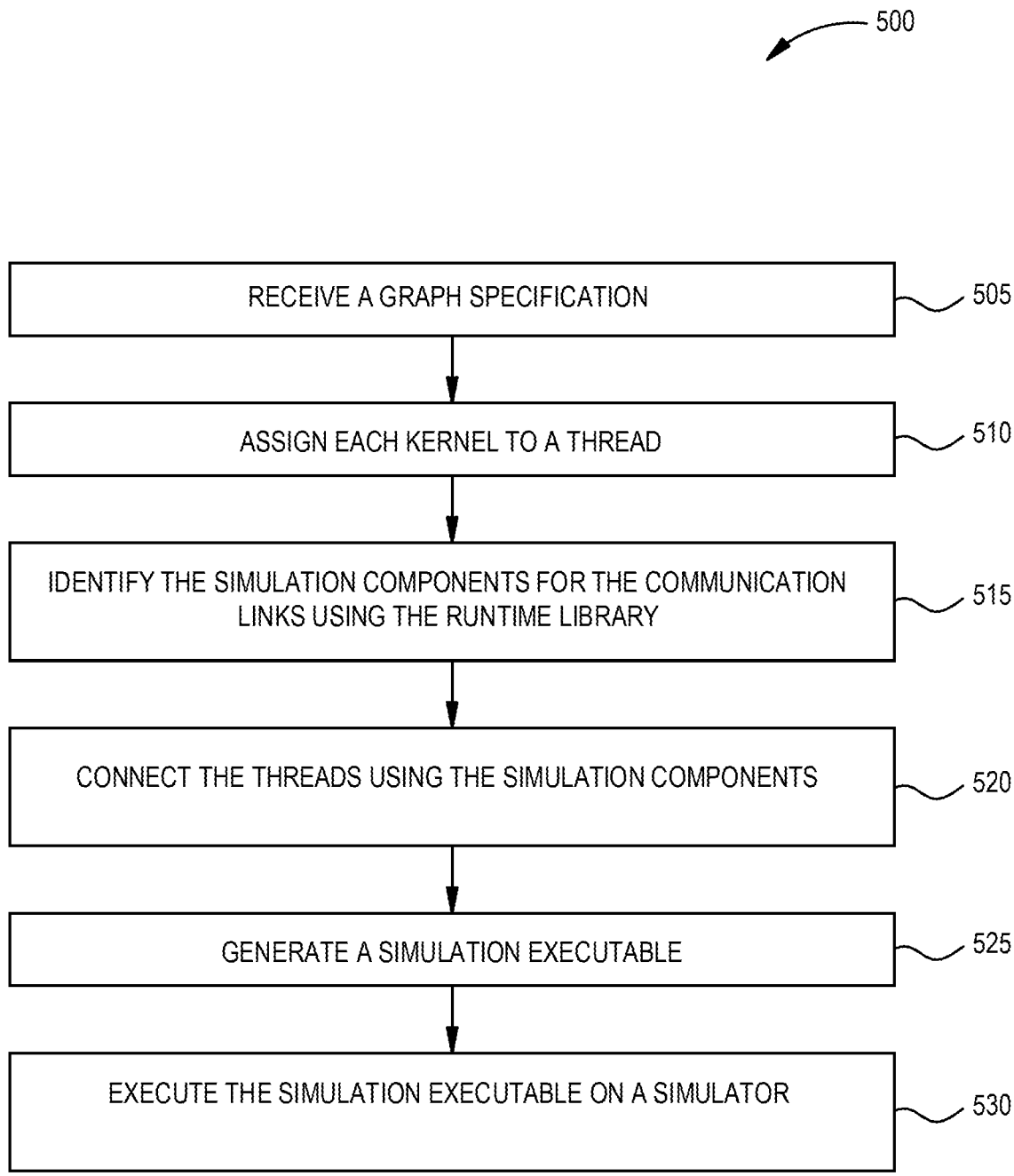
FIG. 5 is a flowchart for simulating a parallelized dataflow graph in a heterogeneous processing environment, according to an example.

FIG. 5 is a flowchart of a method 500 for simulating a parallelized dataflow graph in a heterogeneous processing environment, according to an example. At block 505, the compiler receives a graph specification, which can include source code that defines the nodes and edges of a dataflow graph. For example, the graph specification may include the graph source code, kernel source code, and/or the control source code described in FIG. 4. Regardless, the graph specification defines the various graph objects as well as how those objects communicate (e.g., the different type of communication links used to interconnect the objects).

At block 510, the compiler assigns each kernel to a thread. By assigning each kernel to its own thread (i.e., the kernels do not share the same thread), the simulation maximizes the parallelism of the dataflow graph. In one embodiment, the kernels are assigned to POSIX threads (commonly referred to as pthreads) which allow the simulator to control multiple different flows of work that overlap in time which is especially useful for simulating a dataflow graph. The pthreads can run concurrently in a CPU.

Figure 6:
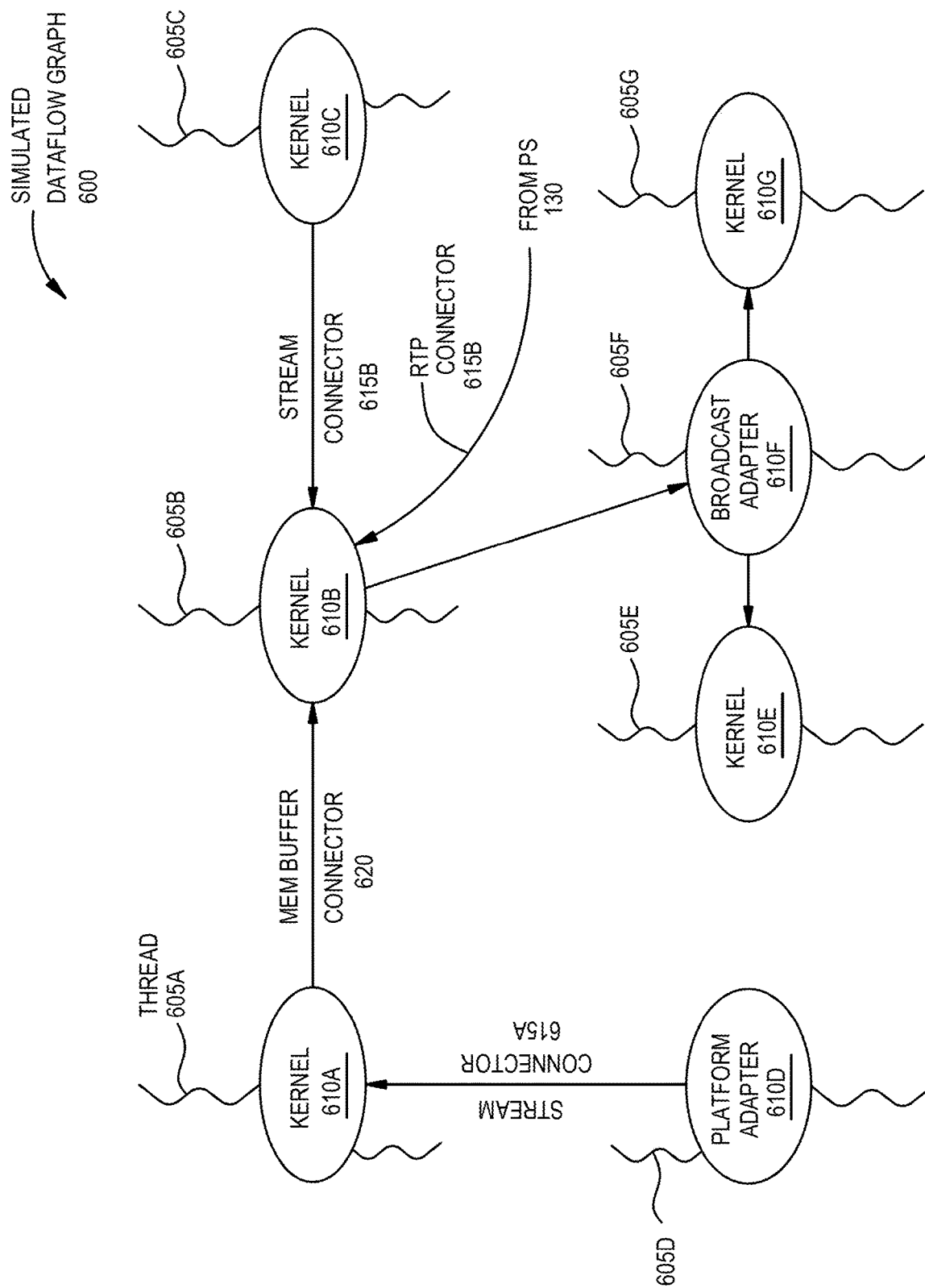
FIG. 6 illustrates assigning graph objects to threads for simulating a parallelized dataflow graph, according to an example.

For clarity, the remaining blocks of method 500 are discussed in parallel with FIG. 6 which illustrates assigning graph objects to threads for simulating a parallelized dataflow graph, according to an example. FIG. 6 illustrates a simulated dataflow graph 600 which includes kernels 610A-G which are respectively assigned to one of the threads 605A-G (which could be pthreads). In this example, each kernel 605 defined in the received graph specification is assigned to its own thread 610.

Returning to method 500, at block 515 the compiler identifies the simulation components for the communication links (e.g., communication channels) using the runtime library. As mentioned above, because the kernels are disposed in a heterogeneous processing environment, the kernels (or nodes) may use a variety of different types of communication links (or edges) to communicate, such as shared memory, a streaming interconnect, a NoC, or a SoC interface block. These communication links may have different protocols that rely on different communication techniques to move data between the kernels. The runtime library includes simulation components which make the different communication links composable so they can be used in the same simulation.

In one embodiment, the simulation components in the runtime library have uniform interfaces which permit the components to be connected to the same kernel. Moreover, the pthreads have conditional variables so that a signal and notify scheme can be used to communicate between the threads (which is discussed later). While many threads use locks to communicate, in method 500 the pthreads can use conditional variables so that the simulation components have a uniform (or shared) interface which allows the use of a signal and notify scheme.

In FIG. 6, the simulation dataflow graph 600 includes different simulation components (which were stored in the runtime library) to represent the different communication links. For example, the kernels 610A and 610B are communicatively coupled by a memory buffer connector 620. This simulation component can represent a buffer in a shared memory in the SoC. For example, according to the graph specification, the kernels 610A and 6106 may be disposed on neighboring DPEs and use a double buffer in a shared memory module to communicate. Alternatively, the graph specification may indicate the kernels, when implemented in the SoC, will be disposed in the same DPE may use a single buffer in a shared memory to communicate.

On the other hand, the graph specification indicates that the kernels 610D and 610A will use a streaming communication link to communicate. Thus, in the simulated graph 600 the kernels 610D and 610A use a first stream connector 615A to communicate, and similarly, the kernels 610C and 610B use a second stream connector 6156 to communicate. These two stream connectors 615 may represent a stream connection in the interconnect in the DPE array illustrated in FIG. 2. The stream connectors 615 may be used when the kernels are hosted in DPEs that do not share a memory module, or when one kernel is hosted by a DPE and another is hosted in programmable logic.

Further, the PS 130 is communicatively coupled to the kernel 610B via an RTP connector 625. In one embodiment, this simulation component represents the communication link used by the PS to control the operation of the dataflow graph in the SoC and/or to dynamically change parameters used by the kernels when processing data.

As mentioned above, the simulation components (e.g., the memory buffer connector 620, the stream connectors 615, and the RTP connector 625) have a uniform interface which makes them composable. For example, the kernel 6106 can receive data using all three of the simulation components since these simulation components have the same interface. Thus, the kernels can be placed on the same type of threads (which are executed on a generic processor) and yet simulate a heterogeneous processing environment where kernels are executed on different processing platforms and use different communication links to communicate.

Often, locks or barriers are used as methods for synchronizing among threads to access shared data structure. Using locks can lead to hand-over-hand locking and deadlock if the locks are not always acquired in the same order. In dataflow applications, the program execution order is determined by flow of data instead of a certain program counter. As a result, locks are not composable in large scale multi-threaded simulation of dataflow graphs. Barriers are also often not suitable as they do not provide point-to-point synchronization and as a result degrade performance. Hence in the simulation framework described herein, shared data structure follow the signal-notify protocol which at least partly enables the communication protocols to be composable. This allows a "happen before" relationship (which determines how stores/reads to memory and from memory should be ordered to avoid corrupting data in memory) to be established between the data producing and data consuming nodes in data flow graph transmitting data using some shared data structure without using locks. As a result, the application does not suffer from hand-over-hand locking and a deadlock can result only from the unavailability of the data or a flaw in the dataflow graph (which we seek to identity) instead of a concurrency issue in the simulation platform.

Returning to method 500, at block 520 the compiler connects the threads using the simulation components, thereby resulting in a connected dataflow graph like the simulated dataflow graph 600 illustrated in FIG. 6.

At block 525, the compiler generates a simulation executable for the simulator. In one embodiment, the executable is transmitted to the simulator as a bitstream. The simulator may be executed on the same host computing system as the compiler, or the simulation executable may be send to a different computing system which hosts the simulator.

At block 530, the simulator executes the simulation executable. The simulator verifies the correctness of the dataflow graph defined by the graph specification. Further, the simulator can detect (or predict) bottlenecks and deadlocks that may occur when the graph is implemented on the SoC which enables the programmer to make changes to the graph specification such as increasing memory assigned to a particular node or re-ordering the kernels. The method 500 can then be repeated as the programmer updates the graph specification in response to the performance data measured by the simulator.

Figure 7:
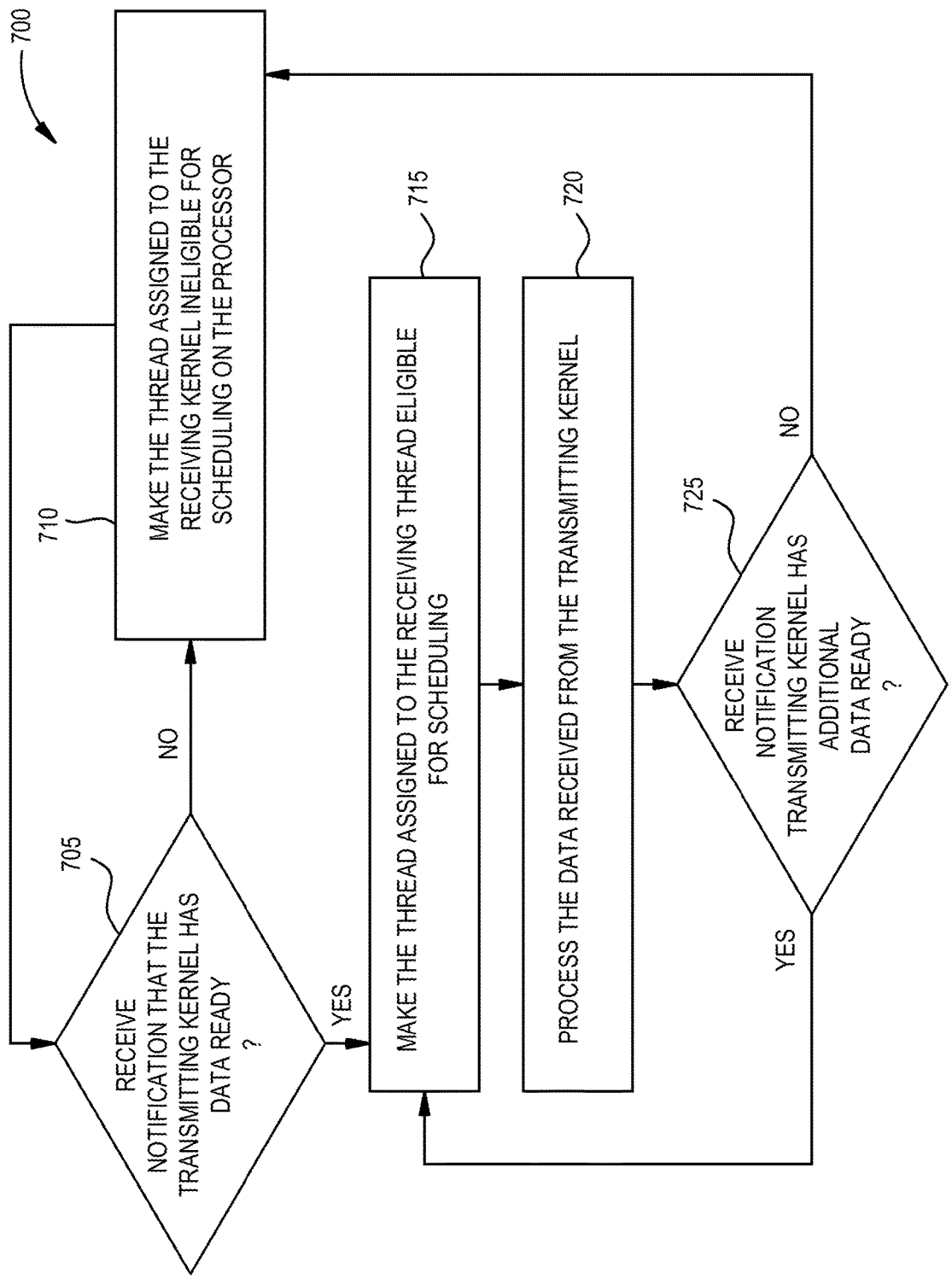
FIG. 7 is a flowchart for performing a wait and notify scheme for communicating between threads in a simulation, according to an example.

FIG. 7 is a flowchart of a method 700 for performing a wait and notify scheme for communicating between threads in a simulation, according to an example. The method 700 begins at block 705 where the thread assigned to a receiving kernel determines whether it has received a notification that a transmitting kernel has data ready. That is, the receiving kernel is downstream from the transmitting kernel in the dataflow graph. Using FIG. 6 as an example, the receiving kernel may be the kernel 610B assigned to the thread 605B (e.g., the receiving thread) while the transmitting kernel is the kernel 610A assigned to thread 605A (e.g., the transmitting thread).

If the transmitting kernel does not have a buffer full of data ready for the receiving kernel, the method 700 proceeds to block 710 where the thread hosting the receiving kernel is made ineligible for scheduling on the processor. That is, the thread does not scheduled any processing time on a CPU or processor. The thread is de-scheduled which means other threads hosting other kernels can be scheduled to use the processor.

However, if the thread hosting the receiving kernel does receive an indication from the transmitting kernel that it has data ready, the method 700 proceeds to block 715 where the thread hosting the receiving kernel is made eligible for scheduling. In one embodiment, if the receiving kernel receives data from multiple kernels (e.g., multiple transmitting kernels), the method 700 waits until a notification has been received from all of the transmitting kernels before proceeding to block 715 and making the thread eligible for scheduling. In this manner, the thread remains ineligible until the input data (which may be received from one upstream kernels or multiple kernels) is ready.

Waiting until a notification to make a thread eligible for scheduling can conserve system resources. Put differently, using a notify and wait scheme can improve the scalability of the simulation which permits the simulation to include more complicated dataflow graphs with more nodes and edges than a simulation that does not use a notify and wait scheme. Thus, using the same amount of compute resources, a simulator that implements a notify and wait scheme can efficiently simulate a more complicated dataflow graph than a simulation that does not.

At block 720, once scheduled and executed on the CPU, the receiving thread processes the data received from the transmitting kernel. Once done, the thread transmits its own notification to any downstream threads hosting a kernel that receives data its kernel. Using FIG. 6 again as an example, once the kernel 610B finishes processing the data received from the kernels 610A and 610C, the thread 605B can send a notification indicating that data is ready for the broadcast adapter kernel 610F hosted by the thread 605F.

At block 725, after processing the received data, the thread determines whether the receiving kernel has received a new notification indicating the transmitting kernel (or kernels) has additional data ready to be processed by the receiving kernel. If not, the method 700 proceeds to block 710 where the thread is then de-scheduled. That is, the thread is no longer eligible to receive processing time on the processor. Thus, this frees the processor time to be used by threads assigned to kernels that do have data ready for processing. Once a new notification is received, the thread can again be made eligible for scheduling at block 705.

However, if at block 725 the transmitting kernel has indicated it has data ready for the receiving kernel, the method 700 proceeds to block 715 where the thread is again scheduled for execution on the processor. In other words, the thread remains eligible for execution on the processor.

The method 700 is just one example of a notify and wait scheme that can be used for scheduling the threads hosting the kernels. In any case, the notify and wait scheme can improve the scalability of the simulator so that only the threads with data ready to be processed are scheduled, thereby freeing the processor time for threads hosting kernels that have data ready to be processed.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method, comprising:
receiving a graph specification defining a plurality of kernels and a plurality of communication links, wherein each communication link of the plurality of communication links couple a respective pair of kernels of the plurality of kernels to form a dataflow graph;
assigning each kernel of the plurality of kernels to a respective thread of a plurality of threads;
identifying simulation components in a runtime library for the plurality of communication links, wherein the plurality of communication links comprises different communication protocols used in a heterogeneous processing environment in a system of a chip (SoC);
connecting the plurality of threads using the simulation components in the runtime library;
generating a simulation executable based on the plurality of threads and the simulation components in the runtime library for simulating the dataflow graph in the heterogeneous processing environment in the SoC; and
executing the simulation executable on a simulator, wherein the simulator verifies a correctness of the dataflow graph defined by the graph specification.

2. The method of claim 1, wherein the heterogeneous processing environment in the SoC comprises programmable logic communicatively coupled to an array of hardened data processing engines (DPEs).

3. The method of claim 2, wherein the graph specification indicates that at least a first kernel of the plurality of kernels is hosted on the array of hardened DPEs and a second kernel of the plurality of kernels is hosted in the programmable logic, and wherein the first and second kernels of the plurality of kernels are communicatively coupled by a communication link of the plurality of communication links in the dataflow graph.

4. The method of claim 1, wherein the simulation components in the runtime library comprise (i) a memory buffer connector representing a buffer in a shared memory of the SoC, (ii) a stream connector representing a stream connection between two data processing engines (DPEs) in the SoC, and (iii) a run time parameter connection representing control commands used to control an operation of the dataflow graph in the SoC.

5. The method of claim 1,
wherein a signal and notify scheme is used to make the plurality of threads eligible and ineligible for scheduling on one or more processors.

6. The method of claim 5, wherein the signal and notify scheme comprises:
de-scheduling a receiving thread of the plurality of threads until receiving a notification that a transmitting thread of the plurality of threads has input data ready for the receiving thread of the plurality of threads; and
upon receiving the notification, making the receiving thread of the plurality of threads eligible for scheduling.

7. The method of claim 5, wherein each thread of the plurality of threads is a pthread.

8. The method of claim 1, wherein only one kernel is assigned to each thread of the plurality of threads.

9. A host, comprising:
a processor; and
a memory storing a runtime library, a simulator, and a compiler,
wherein the compiler is configured to:
receive a graph specification defining a plurality of kernels and a plurality of communication links, wherein each communication link of the plurality of communication links couple a respective pair of kernels of the plurality of kernels to form a dataflow graph;
assign each kernel of the plurality of kernels to a respective thread of a plurality of threads;
identify simulation components in the runtime library for the plurality of communication links, wherein the plurality of communication links comprises different communication protocols used in a heterogeneous processing environment in a system of a chip (SoC);
connect the plurality of threads using the simulation components in the runtime library;
generate a simulation executable based on the plurality of threads and the simulation components in the runtime library for simulating the dataflow graph in the heterogeneous processing environment in the SoC; and
wherein the simulator is configured to:
execute the simulation executable; and
verify a correctness of the dataflow graph defined by the graph specification.

10. The host of claim 9, wherein the heterogeneous processing environment in the SoC comprises programmable logic communicatively coupled to an array of hardened data processing engines (DPEs).

11. The host of claim 10, wherein the graph specification indicates that at least a first kernel of the plurality of kernels is hosted on the array of hardened DPEs and a second kernel of the plurality of kernels is hosted in the programmable logic, and wherein the first and second kernels of the plurality of kernels are communicatively coupled by a communication link of the plurality of communication links in the dataflow graph.

12. The host of claim 9, wherein the simulation components in the runtime library comprise (i) a memory buffer connector representing a buffer in a shared memory of the SoC, (ii) a stream connector representing a stream connection between two data processing engines (DPEs) in the SoC, and (iii) a run time parameter connection representing control commands used to control an operation of the dataflow graph in the SoC.

13. The host of claim 9,
wherein a signal and notify scheme is used to make the plurality of threads eligible and ineligible for scheduling on one or more processors.

14. The host of claim 13, wherein the signal and notify scheme comprises:
de-scheduling a receiving thread of the plurality of threads until receiving a notification that a transmitting thread of the plurality of threads has input data ready for the receiving thread of the plurality of threads; and
upon receiving the notification, making the receiving thread of the plurality of threads eligible for scheduling.

15. A non-transitory computer readable storage medium comprising computer readable program code embodied thereon, the computer readable program code performs operations when executed on a computer processor, the operations comprising:
receiving a graph specification defining a plurality of kernels and a plurality of communication links, wherein each communication link of the plurality of communication links couple a respective pair of kernels of the plurality of kernels to form a dataflow graph;
assigning each kernel of the plurality of kernels to a respective thread of a plurality of threads;
identifying simulation components in a runtime library for the plurality of communication links, wherein the plurality of communication links comprises different communication protocols used in a heterogeneous processing environment in a system of a chip (SoC);
connecting the plurality of threads using the simulation components in the runtime library;
generating a simulation executable based on the plurality of threads and the simulation components in the runtime library for simulating the dataflow graph in the heterogeneous processing environment in the SoC; and
executing the simulation executable on a simulator, wherein the simulator verifies a correctness of the dataflow graph defined by the graph specification.

16. The non-transitory computer readable storage medium of claim 15, wherein the heterogeneous processing environment in the SoC comprises programmable logic communicatively coupled to an array of hardened data processing engines (DPEs).

17. The non-transitory computer readable storage medium of claim 16, wherein the graph specification indicates that at least a first kernel of the plurality of kernels is hosted on the array of hardened DPEs and a second kernel of the plurality of kernels is hosted in the programmable logic, and wherein the first and second kernels of the plurality of kernels are communicatively coupled by a communication link of the plurality of communication links in the dataflow graph.

18. The non-transitory computer readable storage medium of claim 15, wherein the simulation components in the runtime library comprise (i) a memory buffer connector representing a buffer in a shared memory of the SoC, (ii) a stream connector representing a stream connection between two data processing engines (DPEs) in the SoC, and (iii) a run time parameter connection representing control commands used to control an operation of the dataflow graph in the SoC.

19. The non-transitory computer readable storage medium of claim 15,
wherein a signal and notify scheme is used to make the plurality of threads eligible and ineligible for scheduling on one or more processors.

20. The non-transitory computer readable storage medium of claim 19, wherein the signal and notify scheme comprises:
de-scheduling a receiving thread of the plurality of threads until receiving a notification that a transmitting thread of the plurality of threads has input data ready for the receiving thread of the plurality of threads; and
upon receiving the notification, making the receiving thread of the plurality of threads eligible for scheduling.

* * * * *